(12) United States Patent
Matsuo et al.

(10) Patent No.: US 7,247,042 B2
(45) Date of Patent: Jul. 24, 2007

(54) ELECTRICAL SOCKET WHICH CAN BE REDUCED IN OPERATING FORCE

(75) Inventors: Seiya Matsuo, Tokyo (JP); Kazuki Saito, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 11/512,925

(22) Filed: Aug. 30, 2006

(65) Prior Publication Data

US 2007/0049089 A1 Mar. 1, 2007

(30) Foreign Application Priority Data

Aug. 31, 2005 (JP) ............................. 2005-252265
Nov. 8, 2005 (JP) ............................. 2005-323704

(51) Int. Cl.
*H01R 13/62* (2006.01)

(52) U.S. Cl. ..................... 439/330; 439/73; 439/266; 439/331

(58) Field of Classification Search ................ 439/330, 439/331, 73, 266

See application file for complete search history.

(56) References Cited

FOREIGN PATENT DOCUMENTS

| JP | 7-14652 | 1/1995 |
|----|---------|--------|
| JP | 3044460 | 3/2000 |
| JP | 3103760 | 8/2000 |

*Primary Examiner*—Javaid H. Nasri
(74) *Attorney, Agent, or Firm*—Collard & Roe, P.C.

(57) ABSTRACT

In an electrical socket including a base for receiving a connection object in a predetermined direction, a plurality of contacts are held by the base and adapted to be contacted with the connection object. A pusher is rotatably held by the base and has an acting portion and an operating portion which is adapted to be operated. The pusher is continuously urged by a spring so that the connection object is brought into press contact with the contact via the acting portion. A cover is coupled to the base to be movable in the predetermined direction. One of the cover and the operating portion has a contact surface faced to the other in the predetermined direction. The other of the cover and the operating portion has a roller adapted to roll on the contact surface following the movement of the cover.

9 Claims, 10 Drawing Sheets

ELECTRICAL SOCKET WHICH CAN BE REDUCED IN OPERATING FORCE

This application claims priority to prior Japanese patent applications JP 2005-252265 and 2005-323704, the disclosures of which are incorporated herein by reference.

BACKGROUND OF THE INVENTION

This invention relates to an electrical socket to be connected to an electric connection object such as an IC chip.

For example, Japanese Patent (JP-B) No. 3103760 discloses an IC socket having an IC pressing mechanism for pressing an IC to achieve stable contact. The IC pressing mechanism has a structure such that a rotary latch lever is pressed by an edge portion of an actuator (cover). However, since the edge portion and the rotary latch lever move in frictional contact with each other, abrasion powder is produced. The abrasion powder not only becomes a factor increasing an operating force but also may possibly cause a contact failure. In addition, it is difficult to adapt the IC socket to an IC chip having a large number of contacts and to provide the IC socket at a low cost.

Japanese Patent (JP-B) No. 3044460 discloses a socket for testing a semiconductor package, which is capable of preventing a contact failure by holding the semiconductor package with its upper side pressed downward. The socket comprises a plurality of metal contacts of a normal pressing type (the socket has a sheet-connector structure). However, a contacting force of each contact is large. Therefore, if the number of the contacts is large, a spring of a pusher must have an increased pressing force and an operating force inevitably becomes very large.

Japanese Unexamined Patent Application Publication (JP-A) No. H7-14652 discloses an IC package socket capable of mounting and removing an IC package in an unloaded condition. The IC package socket has a structure in which a movable cam is rotated by depressing a cover to displace contacting portions of contacts against an elastic force of a spring portion. However, each contact itself must have a complicated structure and, therefore, the socket can not easily be formed. In addition, each contact is easily deformed. Therefore, adjacent ones of the contacts may be contacted with each other to be short-circuited or the contacts may be nonuniform in contacting condition. Thus, a stable contacting state can not be achieved.

SUMMARY OF THE INVENTION

It is therefore an object of this invention to provide an inexpensive electrical socket which can be reduced in operating force.

It is another object of this invention to provide an electrical socket which can be adapted to an electric connection object having a large number of contacts.

Other objects of the present invention will become clear as the description proceeds.

According to an aspect of the present invention, there is provided an electrical socket comprising a base for receiving a connection object in a predetermined direction, a plurality of contacts held by the base and adapted to be contacted with the connection object, a pusher rotatably held by the base and having an acting portion and an operating portion which is adapted to be operated, a spring continuously urging the pusher and adapted to bring the connection object into press contact with the contact via the acting portion; and a cover coupled to the base to be movable in the predetermined direction, one of the cover and the operating portion having a contact surface faced to the other in the predetermined direction, the other of the cover and the operating portion having a roller adapted to roll on the contact surface following the movement of the cover.

According to another aspect of the present invention, there is provided an electrical socket comprising a base for receiving a connection object in a predetermined direction, a plurality of contacts held by the base and adapted to be contacted with the connection object, a pusher rotatably held by the base and having an acting portion and an operating portion which is adapted to be operated, a spring continuously urging the pusher and adapted to bring the connection object into press contact with the contact via the acting portion, a cover coupled to the base to be movable in the predetermined direction and having a contact surface faced to the operating portion in the predetermined direction, and a roller formed on the operating portion and adapted to roll on the contact surface following the movement of the cover.

According to still another aspect of the present invention, there is provided an electrical socket comprising a base for receiving a connection object in a predetermined direction, a plurality of contacts held by the base and adapted to be contacted with the connection object, a pusher rotatably held by the base and having an acting portion and an operating portion which is adapted to be operated, a spring continuously urging the pusher and adapted to bring the connection object into press contact with the contact via the acting portion, a cover coupled to the base to be movable in the predetermined direction, and a roller formed on a part of the cover which is faced to the operating portion in the predetermined direction, the operating portion having a contact surface, the roller rolling on the contact surface following the movement of the cover.

DESCRIPTION OF THE PREFERRED EMBODIMENTS

At first referring to FIGS. 1A to 1C and 2 to 6, description will be made of a structure of an electrical socket according to a first embodiment of this invention.

The electrical socket illustrated in FIGS. 1A to 1C and 2 comprises a base 1 for receiving an IC chip 21 as a connection object in a predetermined direction, i.e., a vertical direction, nine contact units 10 held on the base 1, two pairs of pushers 3, four in total, rotatably held by the base 1, coil springs 7 continuously urge the pushers 3 in different directions, respectively, and a cover 16 coupled to the base 1 to be slidable in the vertical direction. The base 1 includes a base body or an outer frame 2 having a rectangular shape and made of synthetic resin, a frame 8 holding the contact units 10, and an inner frame 9 adapted to receive an IC chip 21 mounted thereto.

The pushers 3 are disposed on four sides of the bottom of the outer frame 2 to be symmetrical in back-and-forth and left-to-right directions. Each of the pushers 3 is rotatable with respect to a shaft 4. Each pusher 3 has an outer end which serves as an operating portion 3b1. The operating portion 3b1 is provided with a roller 5 attached thereto to be rotatable with respect to a shaft 6. It is to be noted here that, in FIG. 2, only one pair of the pushers 3 is illustrated for simplification of the figure.

The outer frame 2 is provided with base-side spring insertion grooves 2a formed at its bottom to be symmetrical in the back-and-forth and the left-to-right directions. In correspondence to the base-side spring insertion grooves 2a, the pushers 3 are provided with pusher-side spring insertion grooves 3a. Each of the coil springs 7 is compressed and interposed between corresponding ones of the base-side spring insertion grooves 2a and the pusher-side spring insertion grooves 3a.

Further, the outer frame 2 is provided with rotation control stoppers 2b formed at its bottom to be symmetrical in the back-and-forth and the left-to-right directions. The rotation control stoppers 2b serve to inhibit rotation of the pushers 3 beyond a predetermined angle. The frame 8 is disposed at the center of the bottom of the outer frame 2. The inner frame 9 is mounted inside the frame 8.

In order to bias the cover 16, the electrical socket has a biasing mechanism comprising a spring 13 having one end attached to a bias-supported unit 14 formed on the base 1 and the other end attached to the cover 16.

Figure 1A:
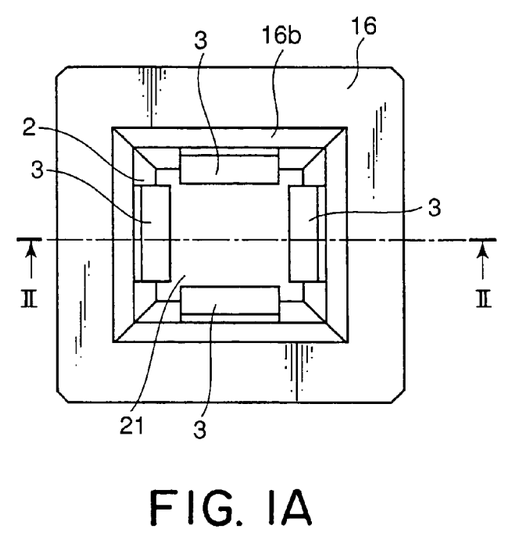
FIGS. 1A to 1C are a plan view, a front view, and a side view of an electrical socket according to a first embodiment of this invention, respectively, when an IC chip is mounted to the electrical socket.
Figure 1B:
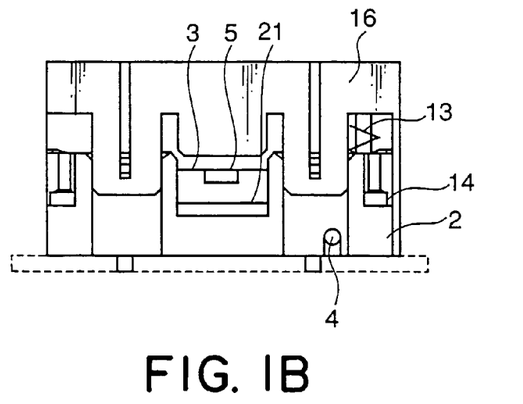
Figure 1C:
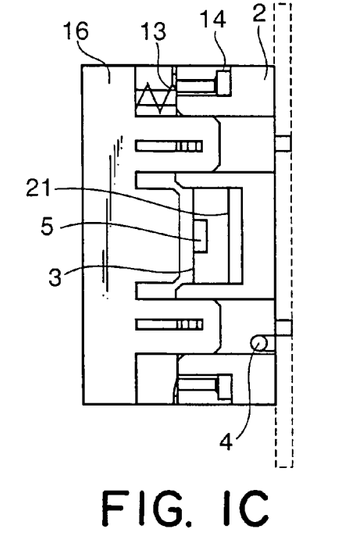
Figure 2:
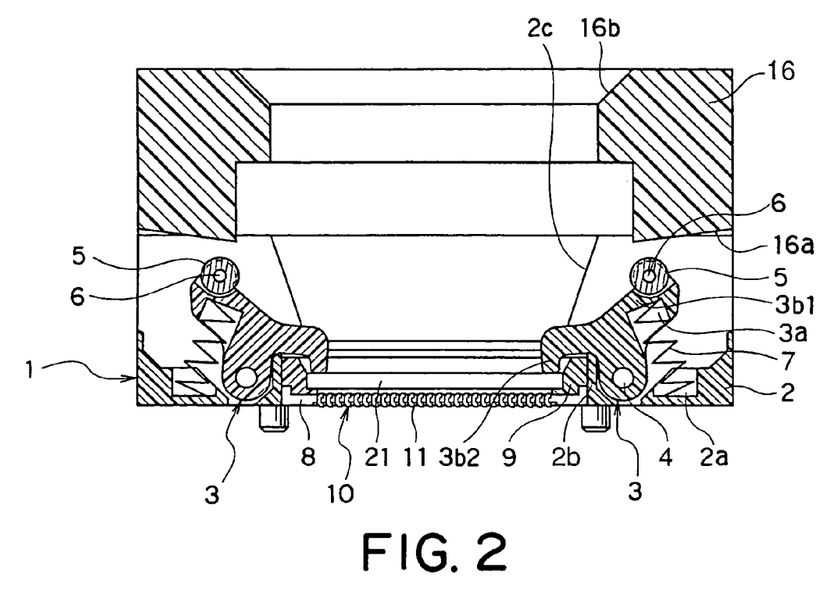
FIG. 2 is a sectional view taken along a line II—II in FIG. 1A.
Figure 3:
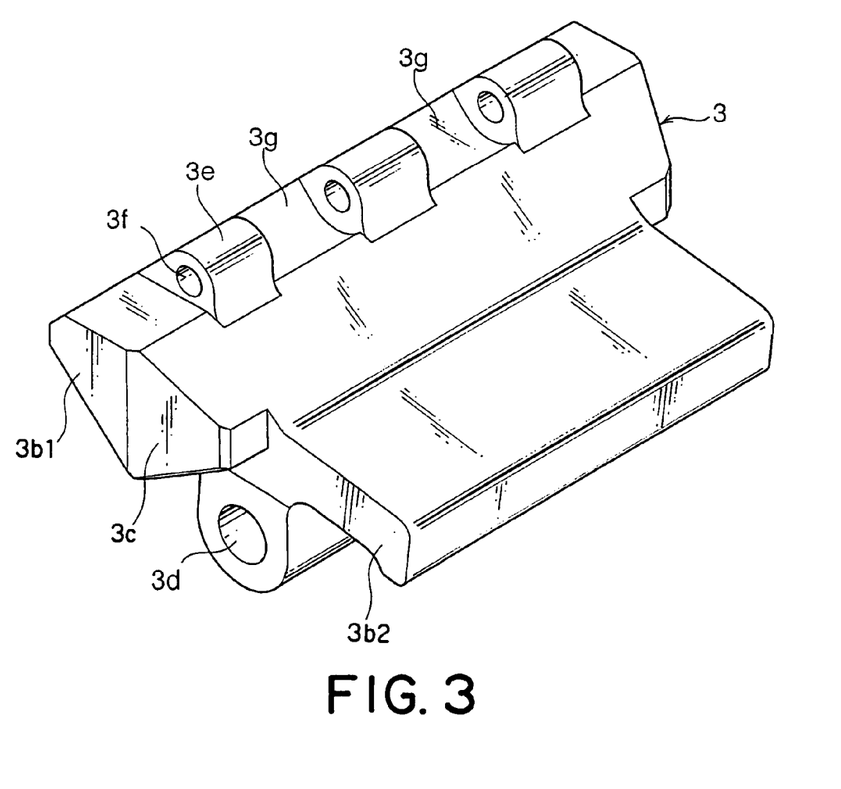
FIG. 3 is an enlarged perspective view of a pusher of the electrical socket illustrated in FIGS. 1A to 1C.

As clearly shown in FIG. 3, each of the pushers 3 has a shaft hole 3d formed at its bottom to receive the shaft 4 inserted therethrough. The pusher 3 is provided with protruding portions 3e formed at three positions at its top and having shaft holes 3f to receive the shaft 6 inserted therethrough. Between every two adjacent ones of the protruding portions 3e, a mounting portion 3g is formed to mount the rollers 5.

Figure 4:
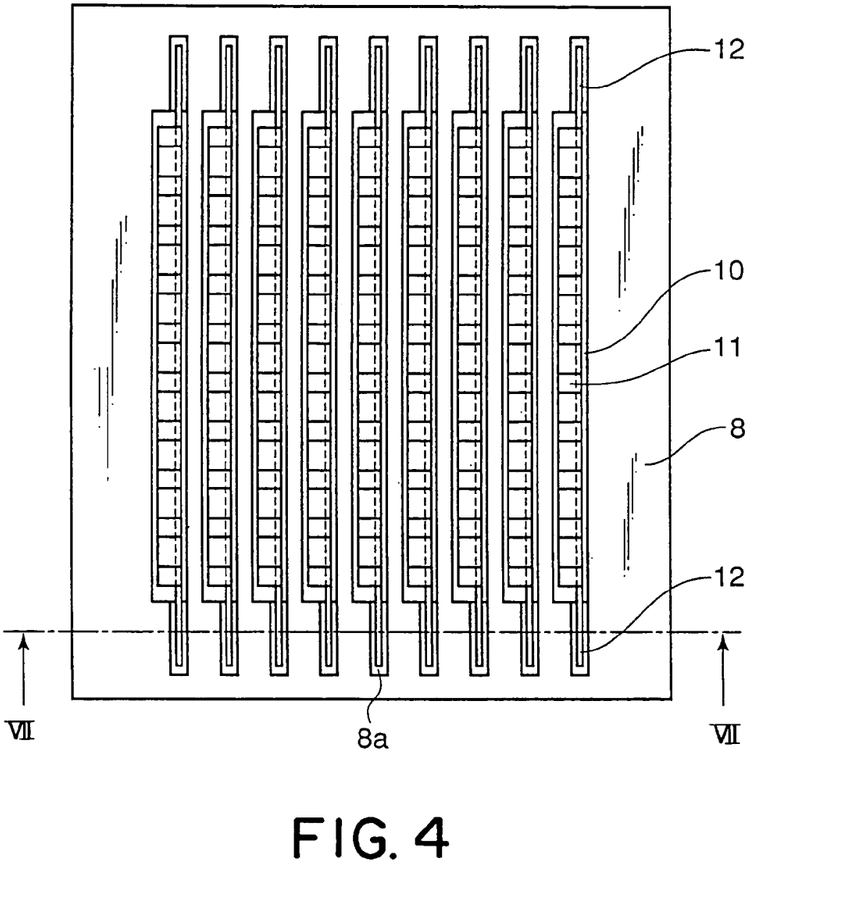
FIG. 4 is a simplified enlarged plan view of a frame of the electrical socket illustrated in FIGS. 1A to 1C when a contact unit is mounted thereto.
Figure 5:
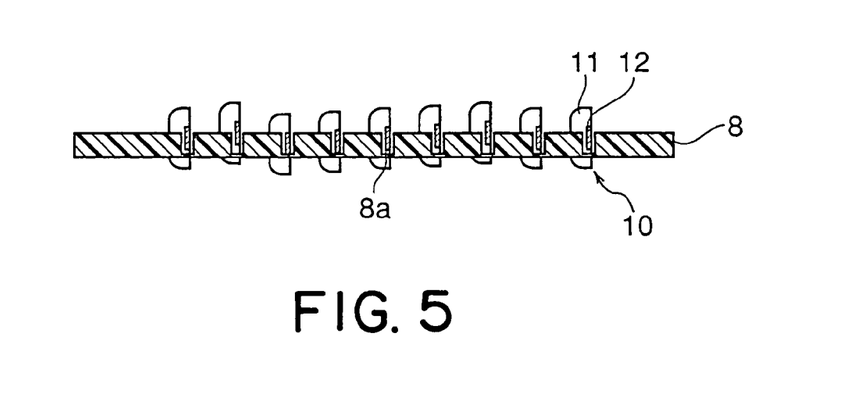
FIG. 5 is a sectional view taken along a line V—V in FIG. 4.

As seen from FIGS. 4 and 5, the nine contact units 10 are disposed on the frame 8 at a predetermined pitch I in the left-to-right direction. Each contact unit 10 has ten contacts 11 disposed at a predetermined pitch in the back-and-forth direction and protruding portions 12 formed at opposite ends in the back-and-forth direction. Each protruding portion 12 is inserted into each of grooves 8a formed on the frame 8 at the predetermined pitch to have a slight floatability in the left-to-right and the back-and-forth directions. Therefore, each contact 11 is held to be floatable with respect to the frame 8.

Figure 6:
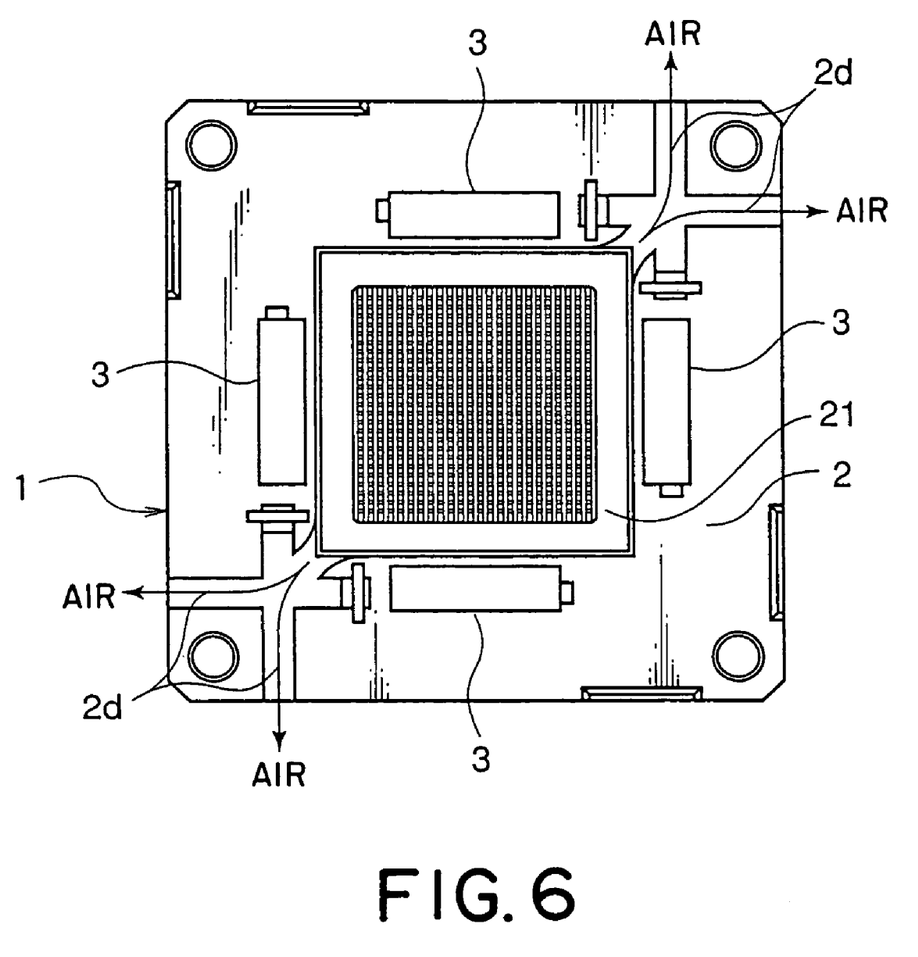
FIG. 6 is a bottom view of the electrical socket illustrated in FIGS. 1A to 1C when the IC chip is mounted thereto.

As shown in FIG. 6, the outer frame 2 is provided with air release grooves 2d formed at diagonal corners on a rear surface thereof to discharge air from the IC chip 21 in directions depicted by arrows. When the IC chip 21 is mounted to the electrical socket, each air release groove 2d smoothly removes air at the bottom of the base 1 to improve insertability of the IC chip 21 and to accelerate cooling of the IC chip 21 and an area therearound.

Next referring to FIGS. 7 and 8 in addition, description will be made of an operation of fitting the IC chip 21 to the above-mentioned electrical socket.

Figure 7:
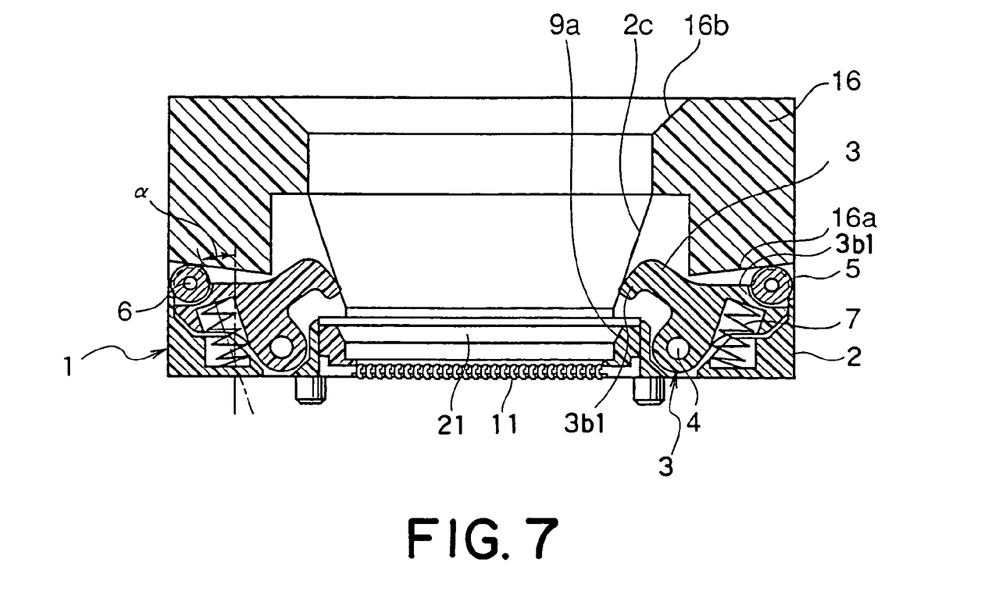
FIG. 7 is a sectional view, similar to FIG. 2, of the electrical socket illustrated in FIG. 1A to 1C when an opening operation is carried out.

When a downward pressing force is applied to an upper surface of the cover 16, the state upon an opening operation illustrated in FIG. 7 is obtained. In this state, the roller 5 is pressed downward by tapered portions 16a formed on a bottom surface of the cover 16 to be symmetrical in the back-and-forth and the left-to-right directions. Therefore, each pusher 3 is rotated around the shaft 4 in a particular direction with compression of each coil spring 7. As a consequence, for example, a right upper part of the left pusher 3 moves leftward and upward and a left upper part of the right pusher 3 moves rightward and upward. A center line of each coil spring 7 and a vertical line form a first spring deflection angle α.

In the state upon the opening operation, the IC chip 21 is inserted downward from above into the center of the cover 16. The IC chip 21 is guided by tapered portions 16b formed on an inner upper part of the cover 16, tapered portions 2c formed on an inner upper part of the base 1, and tapered portions 9a formed on an inner upper part of the inner frame 9. Thereafter, as illustrated in FIG. 8, the IC chip 21 is mounted to the inner frame 9. At this time, solder balls 22 of the IC chip 21 are contacted with the contacts 11. However, the solder balls 22 on left and right ends are disposed so as to leave small gaps with respect to displacement control stoppers 9b formed on inner left and right sides at the bottom of the inner frame 9.

Figure 8:
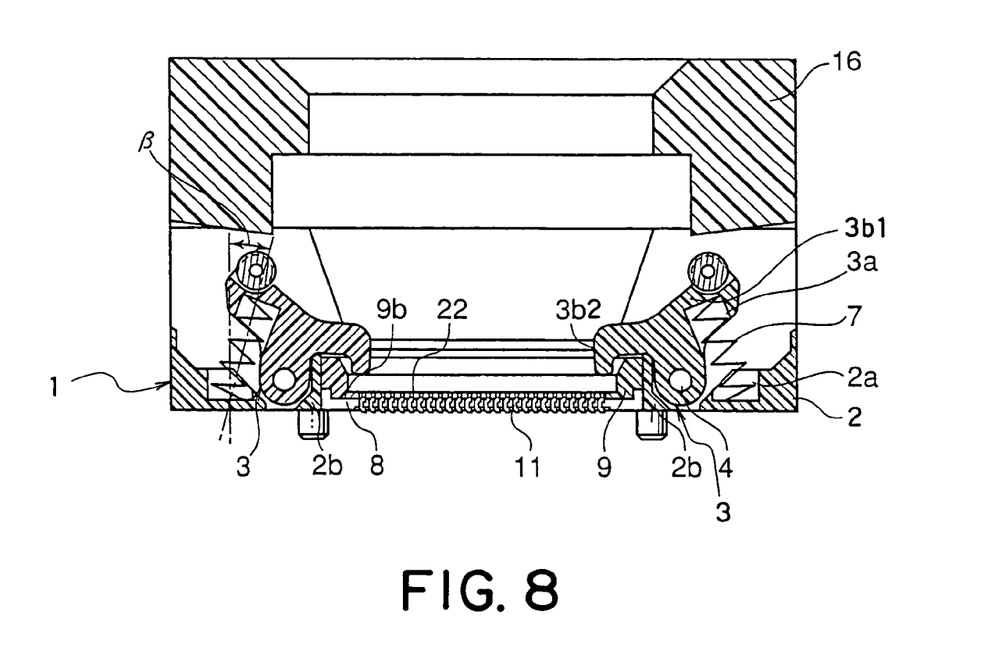
FIG. 8 is a sectional view, similar to FIG. 2, of the electrical socket illustrated in FIGS. 1A to 1C when the IC chip is mounted thereto.

When the pressing force applied to the upper surface of the cover 16 is removed, the cover 16 is returned to a position illustrated in FIG. 8. At this time, by a restoring force of each coil spring 7, each pusher 3 is rotated around the shaft 4 in a specific direction reverse to the above-mentioned particular direction. Thus, for example, an upper right part of the left pusher 3 is moved rightward and downward while an upper left part of the right pusher 3 is moved leftward and downward. Thus, each pusher 3 moves from a position illustrated in FIG. 7 to a position illustrated in FIG. 8. At this time, an inner end portion, i.e., an acting portion 3b2 of each pusher 3 is brought into contact with an upper surface of the IC chip 21 to bring the IC chip 21 into a fitted state. Therefore, the IC chip 21 is prevented from unintentionally released from the electrical socket. At this time, the center line of each coil spring 7 and the vertical line form a second spring deflection angle β.

When the IC chip 21 is not mounted to the electrical socket in the state illustrated in FIG. 7, each pusher 3 is prevented by each rotation control stopper 2b of the outer frame 2 from rotation beyond a predetermined angle.

In order to remove the IC chip 21 mounted to the electrical socket as illustrated in FIG. 8, the opening operation described in conjunction with FIG. 7 is performed again. A whole of the acting portion 3b2 of each pusher 3 is retreated from the upper surface of the IC chip 21 and the IC chip 21 is pulled out.

Figure 9:
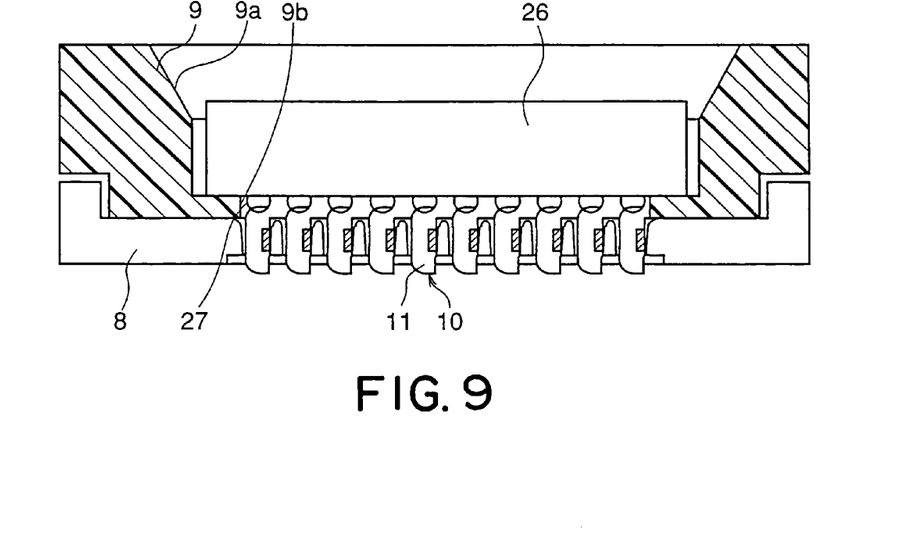
FIG. 9 is an enlarged sectional view of a characteristic part of an electrical socket as a modification of the first embodiment.

Referring to FIG. 9 in addition, description will be made of a modification of the above-mentioned electrical socket. Similar parts are designated by like reference numerals and description thereof will be omitted.

In this modification, the electrical socket according to the first embodiment is modified in design. That is, the inner frame 9 and each pusher 3 are replaced by those different in size and shape so that a BGA chip 26 having a plurality of solder balls 27, smaller in number than the solder balls 22 of the IC chip 21, is fitted as another example of the electric connection object. The inner frame 9 is mounted to the frame 8 disposed on the base 1. The BGA chip 26 is mounted on the displacement control stoppers 9b formed on inner left and right sides at the bottom of the inner frame 9.

The displacement control stoppers 9b have end faces faced to side surfaces of a pair of the solder balls 27 positioned at leftmost and rightmost ends of the BGA chip 26. Therefore, within a range of the gap between each displacement control stopper 9b and each solder ball 27, the BGA chip 26 is put into a floating state with respect to the inner frame 9. Thus, the solder balls 27 of the BGA chip 26 can be connected to the contacts 11 of the electrical socket at proper positions. Since the inner frame 9 is provided with the displacement control stoppers 9b, it is possible to avoid the risk of excessive displacement and plastic deformation of the contacts 11 and the risk of damaging the solder balls 27. For simplicity of illustration, only a small number of the contacts 11 are illustrated in correspondence to the number of the solder balls 27 in the manner similar to FIGS. 4 and 5.

Figure 10:
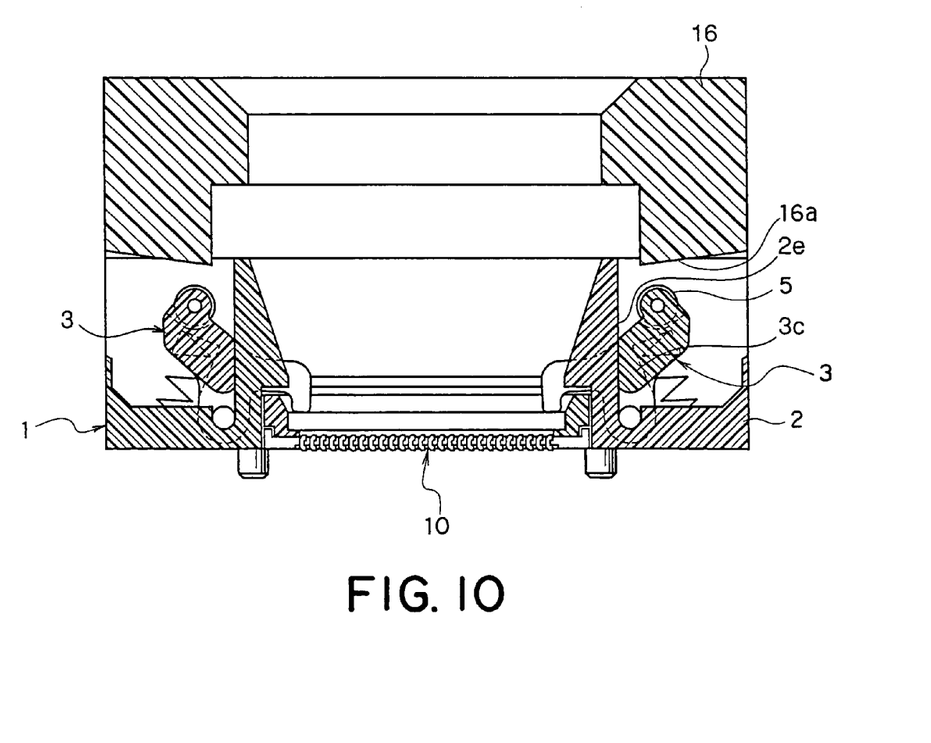
FIG. 10 is a sectional view of an electrical socket according to a second embodiment of this invention when an IC chip is not mounted thereto.
Figure 11:
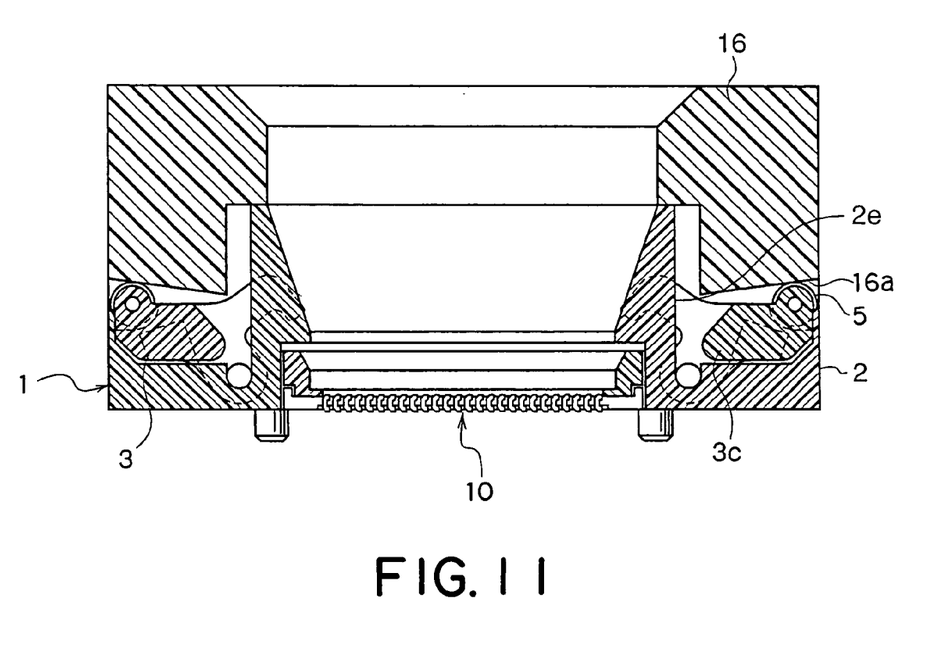
FIG. 11 is a sectional view of the electrical socket illustrated in FIG. 9 when an opening operation is carried out.

Referring to FIGS. 10 and 11, description will be made of an electrical socket according to a second embodiment of this invention. Similar parts are designated by like reference numerals and description thereof will be omitted.

In the electrical socket illustrated in FIGS. 10 and 11, each pusher 3 has an ear-like portion 3c protruding in a direction perpendicular to a drawing sheet of FIG. 10. When the ear-like portion 3c is butted against a butted surface 2e formed on the base 1, rotation of each pusher 3 beyond the predetermined angle is inhibited.

In the state of the opening operation in which the downward pressing force is applied to the upper surface of the cover 16 as illustrated in FIG. 11, the roller 5 of each pusher 3 is pressed by a contact surface 16a comprising each tapered portion of the cover 16. However, when the pressing force applied to the upper surface of the cover 16 is removed, the ear-like portion 3c of each pusher 3 is brought into contact with the butted surface 2e as illustrated in FIG. 10 to inhibit the rotation of each pusher 3. Thus, the butted surface 2e serves as a rotation control stopper.

The structure in which each pusher 3 is provided with the ear-like portion 3c is applicable to the electrical socket according to the first embodiment. Further, both of the base 1 and each pusher 3 may be provided with rotation control stoppers.

Figure 12:
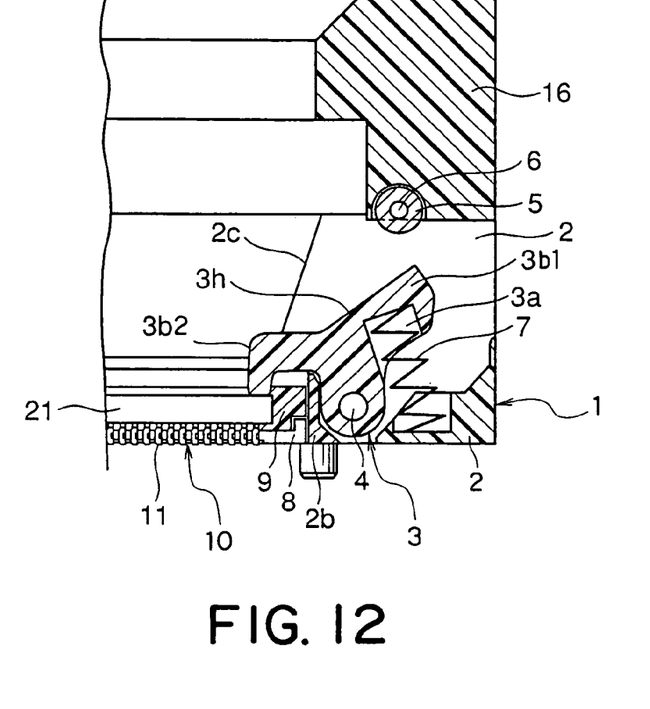
FIG. 12 is a sectional view of a characteristic part of an electrical socket according to a third embodiment of this invention when an IC chip is mounted thereto.
Figure 13:
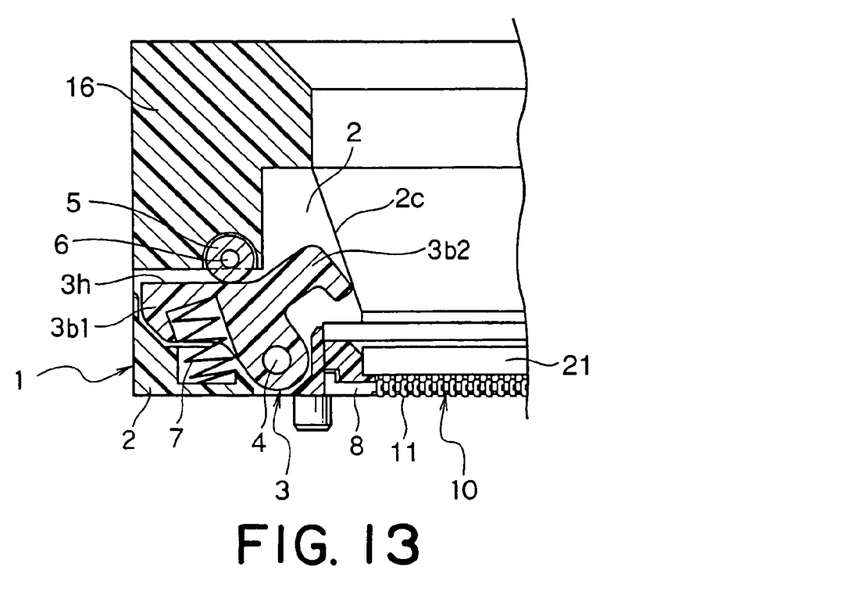
FIG. 13 is a sectional view of a characteristic part of the electrical socket illustrated in FIG. 12 when an opening operation is carried out.

Referring to FIGS. 12 and 13, description will be made of an electrical socket according to a third embodiment of this invention. Similar parts are designated by like reference numerals and description thereof will be omitted.

In the electrical socket illustrated in FIGS. 12 and 13, the cover 16 is provided with the rollers 5. The operating portion 3b1 of each pusher 3 is provided with a contact surface 3h to be brought into contact with each roller 5.

The electrical socket according to this embodiment may be provided with a rotation control stopper similar to that of the electrical socket illustrated in FIGS. 10 and 11. Further, as described in conjunction with FIG. 9, design modification is possible. That is, the inner frame 9 and each pusher 3 may be replaced by those different in size and shape so as to connect the BGA chip 26 as an electric connection object instead of the IC chip 21.

Referring to FIGS. 14A to 14C, 15, and 16, description will be made of an electrical socket according to a fourth embodiment of this invention. Similar parts are designated by like reference numerals and description thereof will be omitted.

Figure 14A:
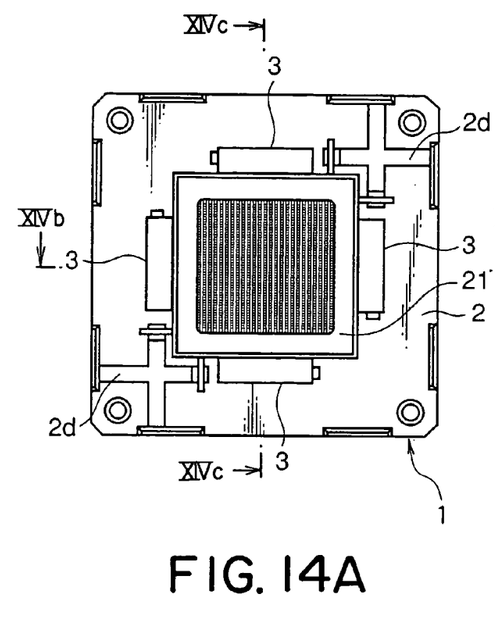
FIG. 14A is a bottom view of an electrical socket according to a fourth embodiment of this invention when an IC chip is mounted thereto.
Figure 14B:
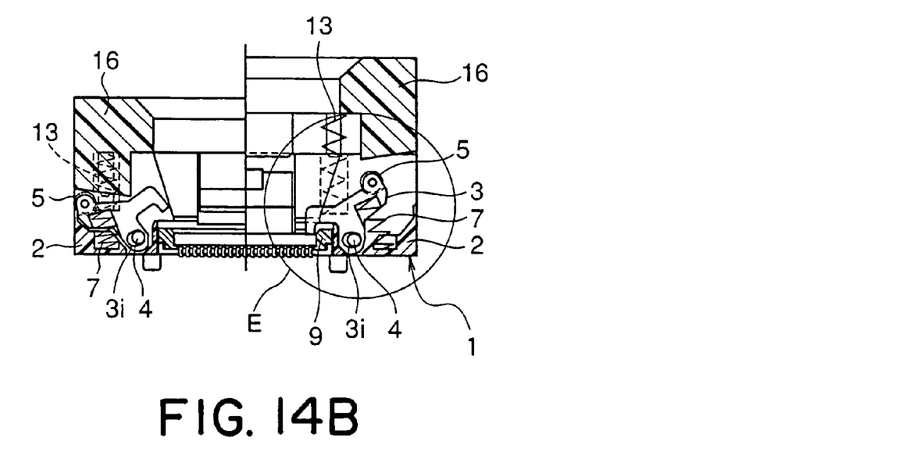
FIG. 14B is a sectional view taken along a line XIVb–X-IVb in FIG. 14A and showing a state where the IC chip is mounted and a state where an opening operation is carried out.
Figure 14C:
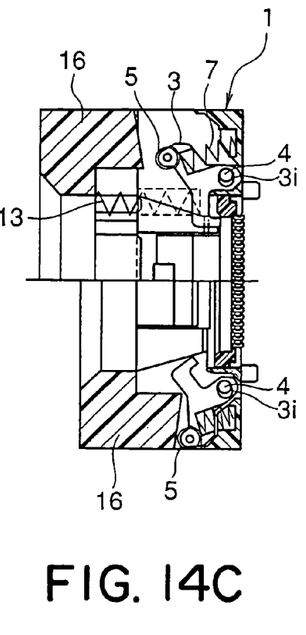
FIG. 14C is a sectional view taken along a line XIVc–X-IVc in FIG. 14A and showing the state where the IC chip is mounted and the state where the opening operation is carried out.

The electrical socket illustrated in the figures similarly has four pushers 3. Each pusher 3 has a long hole 3i fitted to the shaft 4 so as to provide a clearance function of allowing each pusher 3 to be slidable when it is rotated. Thus, contact with the IC chip 21 is stabilized.

Figure 15:
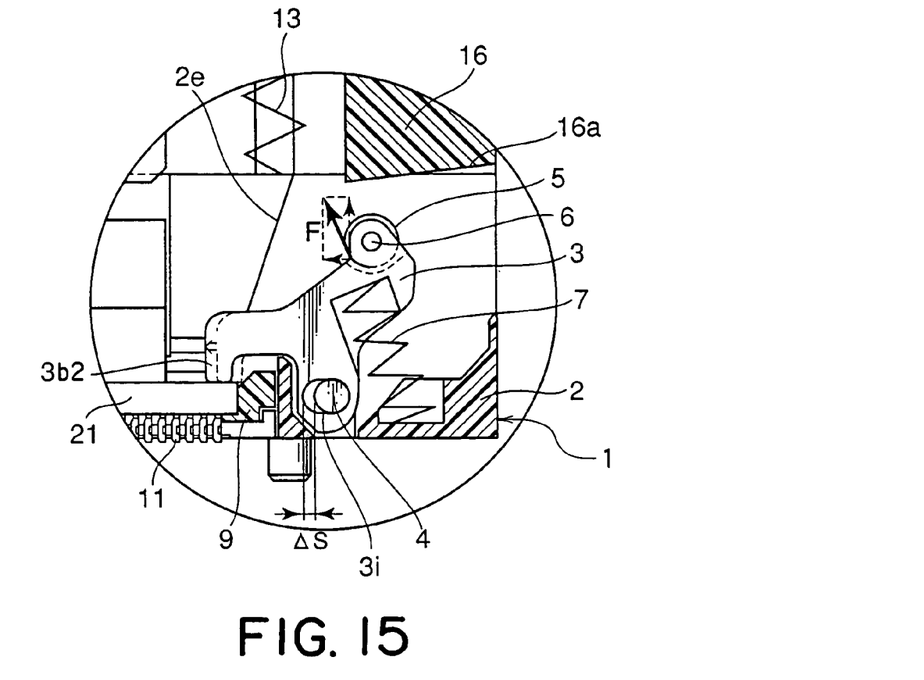
FIG. 15 is an enlarged sectional view of a characteristic part E of the electrical socket illustrated in FIGS. 14A to 14C when the IC chip is mounted thereto.

In the state illustrated in FIG. 15, the cover 16 is biased upward by a restoring force of the spring 13 and is retreated. In this state, the rollers 5 of the pushers 3 are released from the pressing force. Each pusher 3 is biased by a force F derived from a restoring force of the coil spring 7 and directed leftward and upward substantially in an extending direction of the coil spring 7 as illustrated in the figure. The force F can be decomposed into a horizontal component and a vertical component. Therefore, each pusher 3 is slidable in the horizontal direction parallel to a long diameter of the long hole 3 within a range of a sliding amount ΔS as a difference between the long diameter of the long hole 3i and the diameter of the shaft 4.

When the force F derived from the restoring force of the coil spring 7 is applied to each pusher 3, each pusher 3 is pushed leftward. Consequently, each pusher 3 is moved from an initial position where a left end of the inner wall of the long hole 3i is brought into contact with the shaft 4 to a position where the right end is brought into contact with the shaft 4. Following the movement, a pressing portion or the acting portion 3b2 of each pusher 3 slides from a position depicted by a broken line to a position depicted by a solid line over the sliding amount ΔS and presses the IC chip 21. As a result, warping of the IC chip 21 is minimized and elasticity or an operating force of the coil spring 7 need not be increased. In addition, an unstable contacting state is avoided and the contacts 11 can be stably brought into contact with the solder balls 22 of the IC chip 21.

Figure 16:
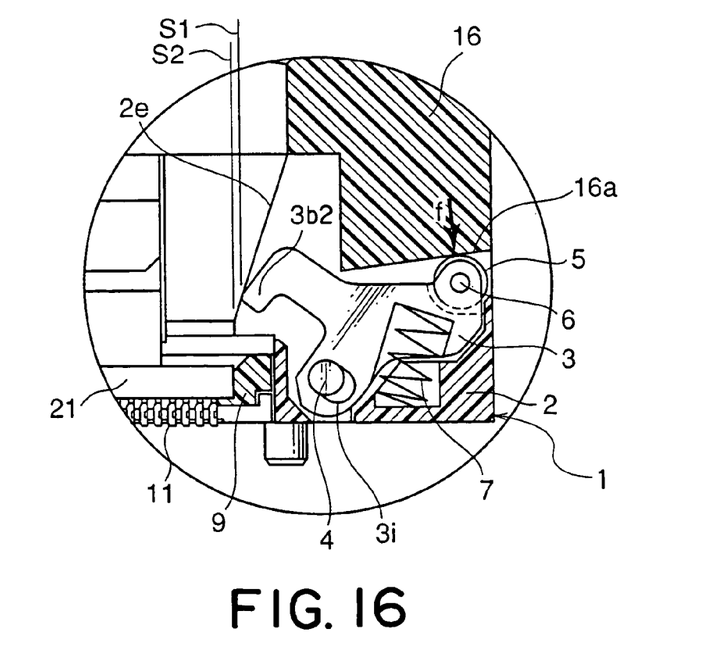
FIG. 16 is an enlarged sectional view, similar to FIG. 15, when the opening operation is carried out.

On the other hand, in the state of the opening operation illustrated in FIG. 16, the cover 16 is biased downward by a pressing operation to compress the spring 13. In this state, the roller 5 of each pusher 3 is pressed by the tapered portion 16a of the cover 16 with a force f directed downward and slightly rightward and rolls on the tapered portion 16a to compress the coil spring 7. Each pusher 3 is rotated clockwise from the state illustrated in FIG. 15 and the acting portion 3b2 is retreated from the principal surface of the IC chip 21.

When each pusher 3 is pressed by the force f through each roller 5, a vertical resistive force generated at a contact point of the tapered portion 16a and each roller 5 and the restoring force of the coil spring 7 act as a force of pressing each pusher 3 rightward before the state illustrated in FIG. 16 is reached. As a consequence, the pusher 3 is moved in the horizontal direction from the initial position where the right end of the inner wall of the long hole 3i is brought into contact with the shaft 4 to the position where the left end is brought into contact with the shaft 4. Following the movement, the acting portion 3b2 of each pusher 3 moves from an opening position S2 by the base 1 to an opening position S1. As a result, unlike the case where a large rotation angle is required and an operability is not excellent, a desired opening size for insertion of the IC chip 21 is obtained with a small rotation angle of each pusher 3 following the pressing of the cover 16. Simultaneously, a whole of each pusher 3 is retreated from a surface of the tapered portion 2e of the base 1. Therefore, when the IC chip 21 is inserted and mounted, a peripheral portion of the IC chip 21 is prevented from being brought into contact with or engaged with the acting portion 3b2 of each pusher 3. Therefore, it is possible to smoothly carry out a series of operations from insertion and mounting of the IC chip 21 in the state of the opening operation illustrated in FIG. 16 to the fitted state illustrated in FIG. 15 where the cover 16 is released from the pressing force. Thus, the operability is excellent.

The above-mentioned electrical socket may have a rotation control stopper similar to that of the electrical socket illustrated in FIGS. 10 and 11. In the manner similar to that described in conjunction with FIG. 9, the above-mentioned electrical socket may be modified in design by changing the inner frame 9 and each pusher 3 into those different in size and shape so that the BGA chip 26 is connected as an electric connection object instead of the IC chip 21. In the manner similar to that described in conjunction with FIGS. 12 and 13, the electrical socket may be modified to have structure in which the cover 16 is provided with the rollers 5 and each pusher 3 is provided with the contact surface.

While the present invention has thus far been described in connection with a few embodiments thereof, it will readily be possible for those skilled in the art to put this invention into practice in various other manners. For example, although two pairs of pushers are provided in each of the foregoing embodiments, this invention can be implemented with only one pair of pushers disposed symmetrically in the transversal or the back-and-forth direction. The air release grooves described in conjunction with FIG. 6 may be implemented in the other embodiments.

What is claimed is:

1. An electrical socket comprising:
   a base for receiving a connection object in a predetermined direction;
   a plurality of contacts held by the base and adapted to be contacted with the connection object;
   a pusher rotatably held by the base and having an acting portion and an operating portion which is adapted to be operated;
   a spring continuously urging the pusher and adapted to bring the connection object into press contact with the contact via the acting portion; and
   a cover coupled to the base to be movable in the predetermined direction;
   one of the cover and the operating portion having a contact surface faced to the other in the predetermined direction;
   the other of the cover and the operating portion having a roller adapted to roll on the contact surface following the movement of the cover.

2. The electrical socket according to claim 1, wherein the contact surface is inclined with respect to the predetermined direction.

3. The electrical socket according to claim 1, wherein the spring is a coil spring.

4. The electrical socket according to claim 1, wherein the base includes a stopper for limiting a rotation angle of the pusher.

5. The electrical socket according to claim 1, wherein the base includes a frame holding the contacts.

6. The electrical socket according to claim 5, wherein the contacts are held on the base to be floatable in the predetermined direction.

7. The electrical socket according to claim 5, wherein the base includes an inner frame mounted to the frame and adapted to receive the connection object mounted in the predetermined direction.

8. The electrical socket according to claim 1, wherein the base is provided with an air release groove on a side opposite to the cover.

9. An electrical socket comprising:
   a base for receiving a connection object in a predetermined direction;
   a plurality of contacts held by the base and adapted to be contacted with the connection object;
   a pusher rotatably held by the base and having an acting portion and an operating portion which is adapted to be operated;
   a spring continuously urging the pusher and adapted to bring the connection object into press contact with the contact via the acting portion;
   a cover coupled to the base to be movable in the predetermined direction and having a contact surface faced to the operating portion in the predetermined direction; and
   a roller formed on the operating portion and adapted to roll on the contact surface following the movement of the cover.

* * * * *